United States Patent
Nagai et al.

(10) Patent No.: US 8,003,963 B2
(45) Date of Patent: Aug. 23, 2011

(54) EXTREME ULTRAVIOLET LIGHT SOURCE APPARATUS

(75) Inventors: Shinji Nagai, Hiratsuka (JP); Takanobu Ishihara, Hiratsuka (JP); Kouji Kakizaki, Hiratsuka (JP); Hiroshi Sobukawa, Tokyo (JP); Takeshi Murakami, Tokyo (JP); Masahiro Inoue, Tokyo (JP)

(73) Assignees: Gigaphton Inc., Tochigi (JP); Ebara Corporation, Tokyo (JP); Kabushiki Kaisha Topcon, Tokyo (JP)

( * ) Notice: Subject to any disclaimer, the term of this patent is extended or adjusted under 35 U.S.C. 154(b) by 110 days.

(21) Appl. No.: 12/605,725

(22) Filed: Oct. 26, 2009

(65) Prior Publication Data

US 2010/0108918 A1    May 6, 2010

(30) Foreign Application Priority Data

Oct. 24, 2008  (JP) .................... 2008-274689
Oct. 21, 2009  (JP) .................... 2009-242869

(51) Int. Cl.
   *G21K 5/00*    (2006.01)
(52) U.S. Cl. ............. 250/504 R; 250/423 R; 250/424
(58) Field of Classification Search ......... 250/423 R, 250/424, 425, 461.1, 489, 504 R
See application file for complete search history.

(56) References Cited

U.S. PATENT DOCUMENTS

| | | | |
|---|---|---|---|
| 7,136,141 B2* | 11/2006 | Bakker | 355/30 |
| 7,915,600 B2* | 3/2011 | Ueno et al. | 250/504 R |
| 2007/0158597 A1* | 7/2007 | Fomenkov et al. | 250/504 R |
| 2008/0017801 A1* | 1/2008 | Fomenkov et al. | 250/354.1 |
| 2008/0087840 A1* | 4/2008 | Ueno et al. | 250/396 ML |
| 2008/0197297 A1 | 8/2008 | Akins et al. | |
| 2010/0078579 A1* | 4/2010 | Endo et al. | 250/504 R |
| 2010/0140513 A1* | 6/2010 | Nagai et al. | 250/504 R |

FOREIGN PATENT DOCUMENTS

JP    2005-197456    7/2005

* cited by examiner

*Primary Examiner* — Bernard E Souw
(74) *Attorney, Agent, or Firm* — McDermott Will & Emery LLP

(57) ABSTRACT

An extreme ultraviolet light source apparatus comprises a target supply unit supplying a target into a vacuum chamber, a laser oscillator outputting a laser light into the vacuum chamber, a collector mirror outputting an extreme ultraviolet light outside by reflecting the extreme ultraviolet light emitted from the target being ionized as a plasma by irradiation with the laser light at a plasma luminescence point in the vacuum chamber, and an ion debris removal unit at least a part of which is located in an obscuration region including the plasma luminescence point.

23 Claims, 13 Drawing Sheets

B-B CROSS SECTION

EXTREME ULTRAVIOLET LIGHT SOURCE APPARATUS

CROSS-REFERENCE TO RELATED APPLICATIONS

This application is based upon and claims the benefit of priority from the prior Japanese Patent Applications No. 2008-274689, filed on Oct. 24, 2008, and No. 2009-242869, filed on Oct. 21, 2009; the entire contents of which are incorporated herein by reference.

BACKGROUND OF THE INVENTION

1. Field of the Invention

The present invention relates to an extreme ultraviolet light source apparatus generating plasma by irradiating a target with a laser light and outputting ultraviolet light emitted from the plasma.

2. Description of the Related Art

In recent years, along with a progress in miniaturization of semiconductor device, miniaturization of transcription pattern used in photolithography in a semiconductor process has developed rapidly. In the next generation, microfabrication to the extent of 70 nm to 45 nm, or even to the extent of 32 nm and beyond will be required. Therefore, in order to comply with the demand of microfabrication to the extent of 32 nm and beyond, development of such exposure apparatus combining an extreme ultraviolet (EUV) light source for a wavelength of about 13 nm and a reflection-type reduction projection optical system is expected.

As the EUV light source, there are three possible types, which are a laser produced plasma (LPP) light source using plasma generated by irradiating a target with a laser beam, a discharge produced plasma (DPP) light source using plasma generated by electrical discharge, and a synchrotron radiation (SR) light source using orbital radiant light. Among these light sources, the LPP light source has such advantages that luminance can be made extremely high as close to the blackbody radiation because plasma density can be made higher. Moreover, the LPP light source also has an advantage that luminescence only with a desired wavelength band is possible by selecting a target material. Furthermore, the LPP light source has such advantages that there is no construction such as electrode around a light source because the light source is a point light source with nearly isotropic angular distributions, extremely wide collecting solid angle can be acquired, and so on. Accordingly, the LPP light source having such advantages is expected as a light source for EUV lithography which requires more than several dozen to several hundred watt power.

In the EUV light source apparatus with the LPP system, firstly, a target material supplied inside a vacuum chamber is excited by being irradiated with a laser light and thus be ionized to become plasma. Then, a cocktail light with various wavelength components including an EUV light is emitted from the generated plasma. Then, the EUV light source apparatus focuses the EUV light by reflecting the EUV light using an EUV collector mirror which selectively reflects an EUV light with a desired wavelength, e.g. a 13.5 nm wavelength component. The reflected EUV light is inputted to an exposure apparatus. On a reflective surface of the EUV collector mirror, a multilayer coating with a structure in that thin coating of molybdenum (Mo) and thin coating of silicon (Si) are alternately stacked, for instance, is formed. The multilayer coating exhibits a high reflectance ratio (of about 60% to 70%) with respect to the EUV light with a 13.5 nm wavelength.

Here, as mentioned above, plasma is generated by irradiating a target with a laser light, and at the same time, particles (debris) such as gaseous ion particles and neutral particles, and tiny particles (metal cluster) which have not been able to become plasma fly out around thereof from a plasma luminescence point. The debris fly toward surfaces of various optical elements such as an EUV collector mirror located in the vacuum chamber, focusing mirrors or focusing lenses for focusing a laser light on a target, and other optical system for measuring an EUV light intensity, and so forth. Therefore, fast ion debris with comparatively high energy erode surfaces of optical elements and damage reflective coating and non-reflective coating of the surfaces. As a result, the surfaces of the optical elements will become a metal component, which is a target material. On the other hand, slow ion debris with comparatively low energy and neutral particle debris will deposit on surfaces of optical elements. As a result, a layer of a compound of metal, which is a target material, is formed on the surfaces of the optical elements. As a result of the debris entering as mentioned above, the reflective coating and the non-reflective coating of each optical element is damaged or a compound layer is formed on the surfaces of the optical elements, whereby reflectance or transmittance of the optical elements decrease and the optical elements become unusable.

In this respect, Japanese patent application Laid-Open No. 2005-197456 discloses a technique such that debris flying from plasma is trapped by a magnetic field generated inside an optical collecting system by a magnetic field generator when current is supplied to the magnetic field generator. According to this technique, by locating a luminescence point of an EUV light within the magnetic field, ion debris flying from the plasma generated around the luminescence point converge in a direction of the magnetic field by Lorentz force by the magnetic field. As a result, contamination of neighboring optical elements with debris and damages of the optical elements can be reduced.

On the other hand, US patent application Laid-Open No. 2008/0197297 discloses a technique with which generated debris are trapped around a plasma luminescence point by a magnetic field generated as a result of making the plasma luminescence point surrounded with wiring and passing current to the wiring.

BRIEF SUMMARY OF THE INVENTION

In accordance with one aspect of the present invention, an extreme ultraviolet light source apparatus comprising a vacuum chamber, a target supply unit supplying a target into the vacuum chamber, a laser oscillator outputting a laser light into the vacuum chamber, and a collector mirror outputting an extreme ultraviolet light outside by reflecting the extreme ultraviolet light emitted from the target being ionized as a plasma by irradiation with the laser light at a plasma luminescence point in the vacuum chamber, the extreme ultraviolet light source apparatus comprises an ion debris removal unit at least a part of which is located in an obscuration region including the plasma luminescence point.

In accordance with another aspect of the present invention, an extreme ultraviolet light source apparatus comprising a vacuum chamber having an optical window for inputting a laser light inside from outside, a target supply unit supplying a target into the vacuum chamber, and a collector mirror outputting an extreme ultraviolet light outside by reflecting the extreme ultraviolet light emitted from the target being ionized as a plasma by irradiation with the laser light at a plasma luminescence point in the vacuum chamber, the extreme ultraviolet light source apparatus comprises an ion debris removal unit at least a part of which is located in an obscuration region including the plasma luminescence point.

These and other objects, features, aspects, and advantages of the present invention will become apparent to those skilled in the art from the following detailed description, which, taken in conjunction with the annexed drawings, discloses preferred embodiments of the present invention.

DETAILED DESCRIPTION OF THE INVENTION

Now, exemplary embodiments of an extreme ultraviolet light source apparatus according to the present invention will be described in detail with reference to the accompanying drawings.

First Embodiment

Figure 1:
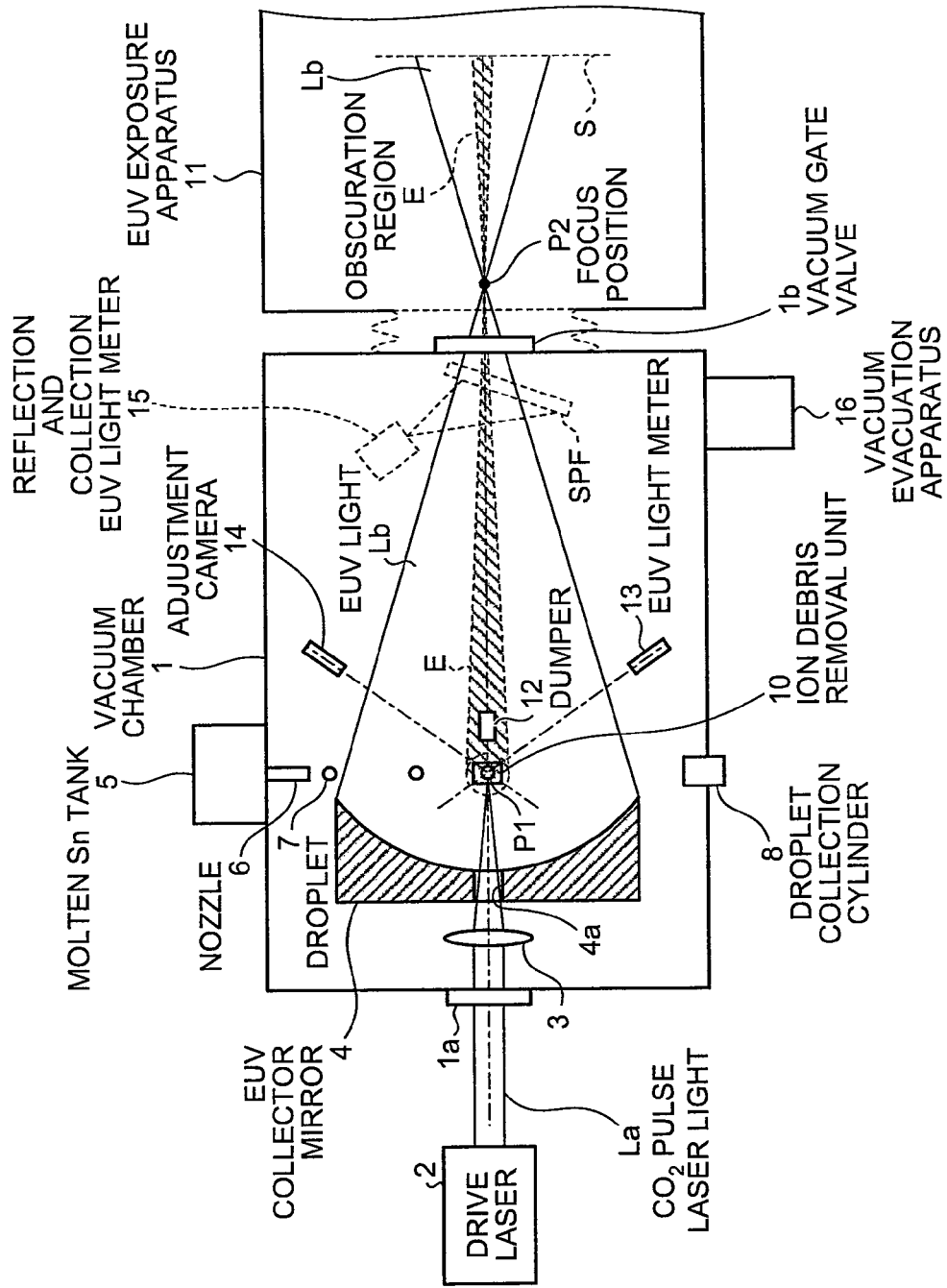
FIG. 1 is a schematic diagram showing a structure of an extreme ultraviolet light source apparatus according to a first embodiment of the present invention.
Figure 2:
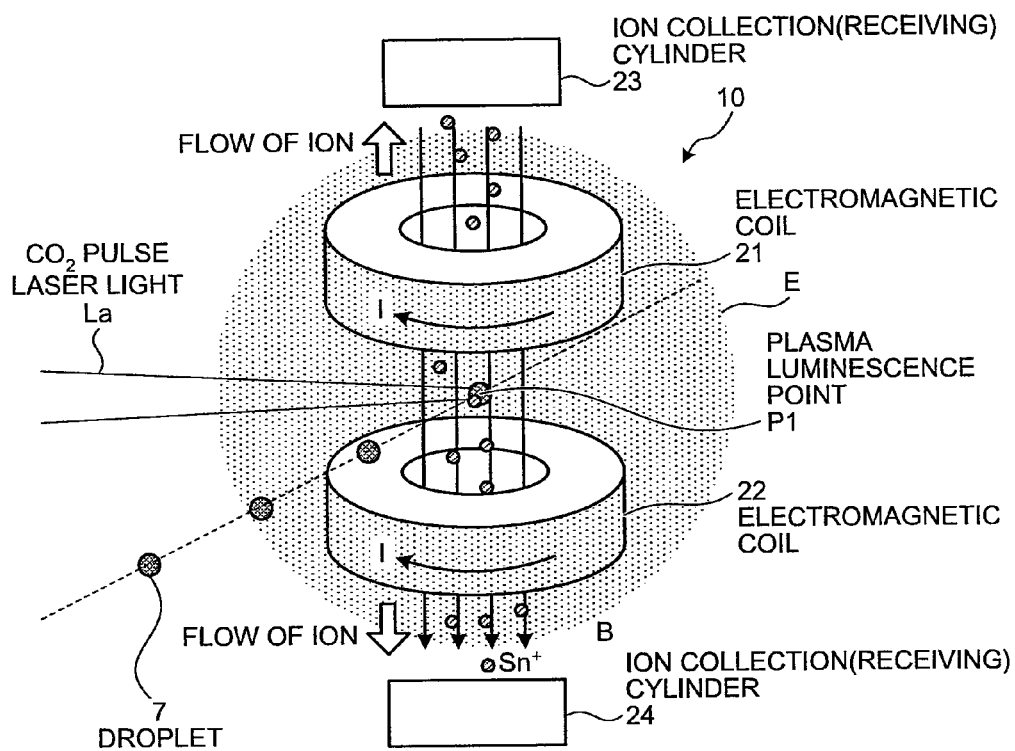
FIG. 2 is a schematic diagram showing a structure of an ion debris removal unit in the extreme ultraviolet light source apparatus according to the first embodiment.

FIG. 1 is a schematic diagram showing a structure of an extreme ultraviolet light source apparatus according to a first embodiment of the present invention. FIG. 2 is a schematic diagram showing a structure of an ion debris removal unit in the extreme ultraviolet light source apparatus shown in FIG. 1. In FIGS. 1 and 2, the extreme ultraviolet light source apparatus has a vacuum chamber 1 in which a plasma luminescence point P1 is located. In this particular embodiment, the vacuum chamber may be a low pressure chamber that includes a small amount of gas other than a high vacuum chamber. Moreover, for instance, it is possible that the vacuum chamber contains a buffer gas (He gas, Ar gas, or the like) and an etching gas, of which pressure is to the extent that does not influence the operation of the ion debris removal unit. In particular, when a target is Sn, as for the etching gas, low pressure hydrogen gas, halogen gas, halogen hydride gas, hydrogen radical gas, or the like can be used. These etching gases have high transmittance with respect to an EUV light while being able to etch Sn. A $CO_2$ pulse laser light La emitted from a drive laser 2 which is located outside the vacuum chamber 1 enters inside the vacuum chamber 1 via a window 1a provided for inputting a laser light of the vacuum chamber 1. The $CO_2$ pulse laser light La is focused on the plasma luminescence point P1 through an optical collecting system 3 within the vacuum chamber 1 and an aperture 4a of an EUV collector mirror 4.

A molten Sn tank 5 stores a liquid metal of Sn, and discharges droplets 7 of Sn as being targets from a nozzle 6. The nozzle 6 discharges the droplets 7 so that the droplets 7 pass through the plasma luminescence point P1. Here, in order to irradiate each droplet 7 with the $CO_2$ pulse laser light La at the plasma luminescence point P1, each output timing of the droplet 7 and each pulse timing of the $CO_2$ pulse laser light La are controlled to be synchronous by a controller (not shown).

In the vacuum chamber 1, the EUV collector mirror 4 is mounted. The EUV collector mirror 4 reflects an EUV light Lb emitted from the plasma generated by the droplet 7 being irradiated with the $CO_2$ pulse laser light La, in such a way that the EUV light Lb is focused. The reflected EUV light Lb is outputted from a window of a vacuum gate valve 1b in the vacuum chamber to an EUV exposure apparatus 11. Here, in the vacuum chamber 1, an ion debris removal unit 10 for trapping charged particles generated from the plasma produced at the plasma luminescence point P1 is mounted. The ion debris removal unit 10 is mounted so that at least a part of the ion debris removal unit 10 is located in an obscuration region E.

The obscuration region E refers to a region corresponding to an angular range in which EUV light Lb focused by the EUV collector mirror 4 will not be used in the EUV exposure apparatus 11. That is, the EUV light Lb emitted from the plasma luminescence point P1 is focused on a focus position P2 by the EUV collector mirror 4. In this explanation, such three-dimensional solid region at the focus point P2 corresponding to the angular range in which the EUV light Lb will not be used in the EUV exposure apparatus 11 is defined as the obscuration region E. Usually, the EUV light in the obscuration region E is not used in the exposure apparatus 11. Therefore, exposure performance and throughput of the exposure apparatus will not be influenced even if the EUV light in the obscuration region E is not inputted to the exposure apparatus.

The obscuration region E is spatially distributed in each of both of the extreme ultraviolet light source apparatus and the EUV exposure apparatus. In this respect, in the first embodiment, the ion debris removal unit 10 is arranged inside the obscuration region E. Thereby, it is possible to mount the ion debris removal unit 10 inside the extreme ultraviolet light source apparatus without reducing power of the EUV light that is used for exposure in the EUV exposure apparatus 11.

Moreover, the extreme ultraviolet light source apparatus has a droplet collection cylinder 8 which collects the droplets 7 outputted from the nozzle 6. The droplet collection cylinder 8 is located at a place facing the nozzle 6. Residual droplets such as droplets not used for generation of plasma and droplets remaining after the generation of plasma are collected by the droplet collection cylinder 8. The collected droplets can be reused as droplets by being supplied to the molten Sn tank 5 again after a recycling process.

A dumper 12 absorbs the $CO_2$ pulse laser light La which was not emitted to the droplet 7 or which did not contribute to generate plasma even if the $CO_2$ pulse laser light La was emitted to the droplet 7. Moreover, an adjustment camera 14 and an EUV light meter 13 monitor a position of the droplet 7 and developmental state of plasma in the plasma luminescence point P1 in order to control output timing of each droplet 7 and output timing of the $CO_2$ pulse laser light La. Furthermore, a reflection and collection EUV light meter 15 measures a power of the EUV light Lb outputted from the extreme ultraviolet light source apparatus based on a part of the EUV light Lb reflected by a spectrum pass filter SPF. Furthermore, a vacuum evacuation apparatus 16 is a turbo molecular pump (TMP), or the like, and maintains degree of vacuum in the vacuum chamber 1.

As shown in FIG. 2, the ion debris removal unit 10 has a pair of electromagnetic coils 21 and 22 mounted in such a way as to sandwich the plasma luminescence point P1. As described above, the pair of electromagnetic coils 21 and 22 are located in the obscuration region E. By passing current to the pair of electromagnetic coils 21 and 22 as shown in FIG. 2, a magnetic field of which magnetic direction is a direction passing through inside both bores of the electromagnetic coils 21 and 22, is generated. The magnetic field includes a convergence region expanding in the magnetic direction around the plasma luminescence point P1. The ion debris such as $Sn^+$ are converged inside the convergence region. The trapped ion debris adheres to inner walls of ion collection (receiving) cylinders 23 and 24 mounted outside the electromagnetic coils 21 and 22, respectively, after passing through the bores of the electromagnetic coils 21 and 22. The ion debris having adhered to the inner walls of the ion collection (receiving) cylinders 23 and 24 is collected later. In FIG. 2, the ion collection (receiving) cylinders 23 and 24 are mounted outside the obscuration region E, but it is also possible that the ion collection (receiving) cylinders 23 and 24 are mounted inside the obscuration region E.

The pair of the electromagnetic coils 21 and 22 can be located near the plasma luminescence point P1 as being closely arranged with a several mm distance in between, for instance. Therefore, even if downsized electromagnetic coils are used as the electromagnetic coils 21 and 22, it is possible to generate a local magnetic field with an approximately several T near the plasma luminescence point P1. Furthermore, due to the electromagnetic coils 21 and 22 are located inside the obscuration region E, the EUV light Lb will not be shadowed. Moreover, by using the downsized electromagnetic coils 21 and 22, it is possible to downsize an occupation space in the vacuum chamber 1, and therefore, it is possible to enhance miniaturization of the extreme ultraviolet light source apparatus. Moreover, when the downsized electromagnetic coils 21 and 22 are used, a density of magnetic flux formed outside the plasma luminescence point P1 is low, meaning that is a leak magnetic field from the extreme ultraviolet light source apparatus can be attenuated, and therefore, it is possible to reduce possible influence of the leak magnetic field on apparatuses other than the extreme ultraviolet light source apparatus, e.g. the EUV exposure apparatus 11.

Second Embodiment

Next, a second embodiment of the present invention will be described in detail. In the above-described first embodiment, the ion debris removal unit 10 forms the local magnetic field near the plasma luminescence point P1 in order to trap and collect ion debris. On the other hand, in the second embodiment, a local electrical field is formed near the plasma luminescence point P1 in order to trap and collect ion debris.

Figure 3:
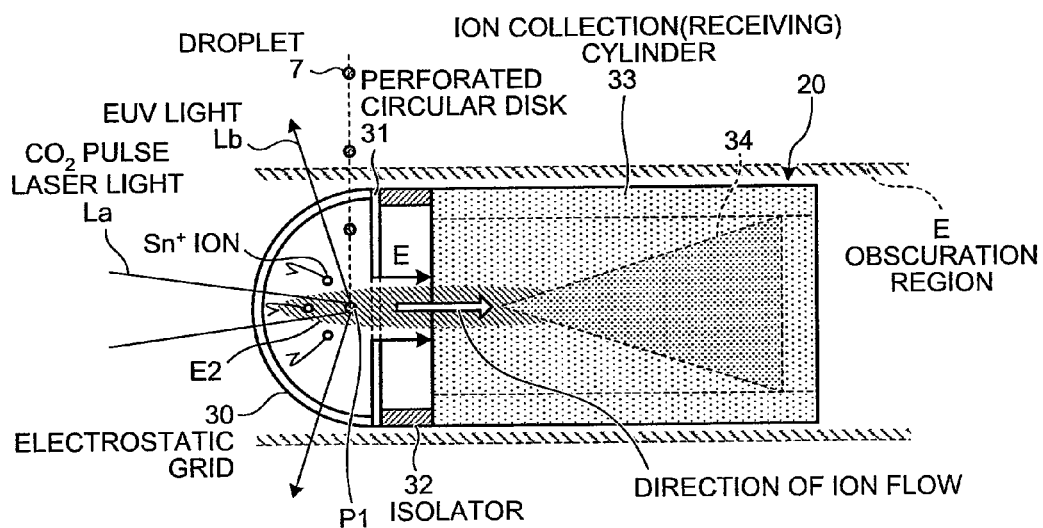
FIG. 3 is a vertical cross-sectional diagram showing a structure of an ion debris removal unit according a second embodiment of the present invention.

FIG. 3 is a vertical cross-sectional diagram showing a structure of an ion debris removal unit in an extreme ultraviolet light source apparatus according to the second embodiment of the present invention. As shown in FIG. 3, the ion debris removal unit 20 is located inside the obscuration region E. On a side of the EUV collector mirror 4 with respect to the plasma luminescence point P1, a centroclinal electrostatic grid 30 is mounted. Moreover, on an opposite side of the EUV collector mirror 4 with respect to the plasma luminescence point P1, a cylindrical ion collection (receiving) cylinder 33 is mounted while a perforated circular disk 31 is sandwiched between the plasma luminescence point P1 and the ion collection (receiving) cylinder 33.

Figure 4:
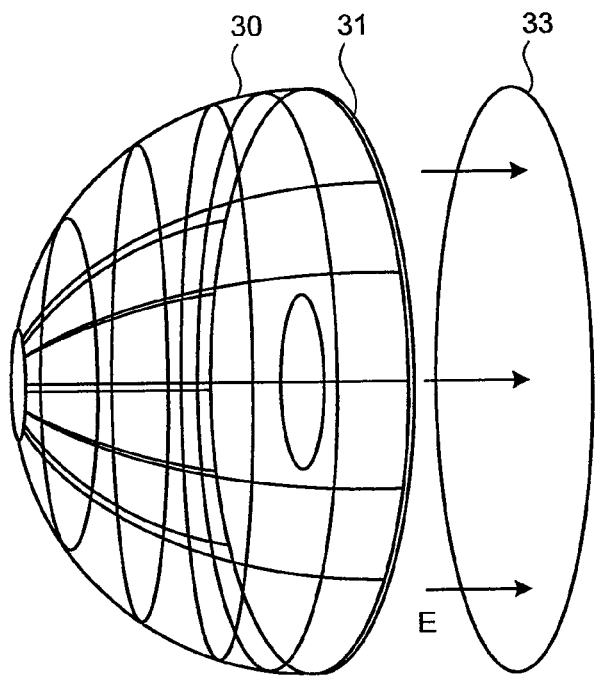
FIG. 4 is a perspective view of a structure of an electrostatic grid in the ion debris removal unit shown in FIG. 3.
Figure 5:
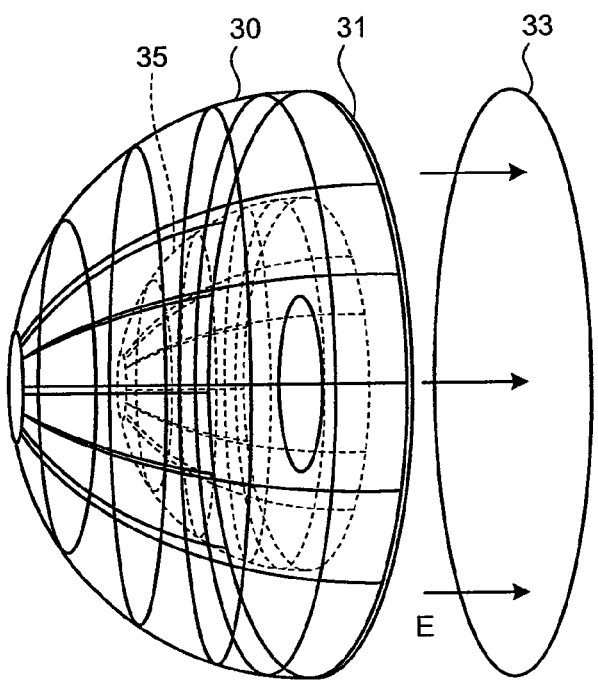
FIG. 5 is a perspective view of a structure of an alternate example of the electrostatic grid in the ion debris removal unit shown in FIG. 3.
Figure 6:
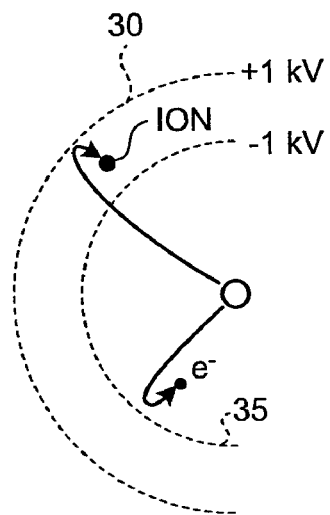
FIG. 6 is an illustration explaining operation of ion and electron according to the alternate example of the electrostatic grid in the ion debris removal unit shown in FIG. 5.

As shown in FIG. 4, the electrostatic grid 30 and the perforated circular disk 31 are electrically connected with each other and have a positive electric potential of about 1 to 3 kV applied to, respectively. On the other hand, the ion collection (receiving) cylinder 33 is grounded. The electrostatic grid 30 is a grid with an aperture ratio of over 90%, and does not substantially disturb incidence of the $CO_2$ pulse laser light La or emission of the EUV light Lb. Furthermore, at a center of the perforated circular disk 31, an aperture of 10 mm in diameter is opened. As described above, a size of the ion debris removal unit 20 is small enough to fit within the obscuration region E. As the size of the ion debris removal unit 20, a diameter thereof is about 30 mm, for instance. More preferably, as shown in FIGS. 5 and 6, the electrostatic grid 30 has an about 1 kV negative voltage applied to, while another grid 35 is mounted inside the electrostatic grid 30 in order to rebound approximately the same number of electrons that are generated along with ions. Thereby, it is possible to remove both ions and electrons.

Positive charged ion debris charged by the positive electric potential at the electrostatic grid 30 is rebounded by a reactive Coulombic force and gravitated toward a side of the ion collection (receiving) cylinder 33, which is a lower electric potential side, through the perforated circular disk 31. In addition, in order to form a gap, an isolator 32 with electrical resistance such as $AL_2O_3$ is mounted between each the electrostatic grid 30 and the ion collection (receiving) cylinder 31, and the perforated circular disk 31 and the ion collection (receiving) cylinder 33. It is preferred that an interval of the gap is good enough to not cause insulation breakdown, e.g. over 5 mm, for instance.

In the ion collection (receiving) cylinder 33, a conular projection 34 with a vertex facing toward the EUV collector mirror 4 is mounted. Due to the vertex of the projection 34 facing an incident side of the $CO_2$ pulse laser light La, a surface area of a surface irradiated with the $CO_2$ pulse laser light La becomes larger, and thereby, it is possible to improve a dumper performance with respect to the $CO_2$ pulse laser light La. The ion debris will adhere to an inner wall of the ion collection (receiving) cylinder 33, and then collected.

As for the perforated circular disk 31, a plate-like SiC or MN with artificial diamond coating on a surface is used. However, it is not limited to such arrangement, while the perforated circular disk 31 can be made from a material with heat resistance and high conductivity. Furthermore, it is preferable that the whole ion collection (receiving) cylinder 33 is thermally controlled to be over the melting point of the target material (230 degrees C. being the melting point of the Sn, for instance) in order to liquefy and discharge the collected (received) ion debris. Furthermore, it is preferable that the ion collection (receiving) cylinder 33 is made from Cu or the like, which is a material with high conductivity. Moreover, it is preferable that a surface of the ion collection (receiving) cylinder 33 is coated with Mo, C and Ti, or the like, which show high resistant against ion-sputtering. Moreover, when the surface of the ion collection (receiving) cylinder 33 is coated with Mo as being a component material of a multilayer coating of the EUV collector mirror, it is possible to prevent the reflectance of the EUV collector mirror from decreasing even if the surface of the ion collection (receiving) cylinder 33 is sputtered.

In the second embodiment, by having the structure in that ion debris is collected (received) by having the local magnetic field formed in the obscuration region E, it is possible to obtain the same effects as in the first embodiment. The other structures and effects are the same as in the above-described embodiment, and redundant explanations will be omitted herein.

Third Embodiment

Next, a third embodiment of the present invention will be described in detail. In the third embodiment, in addition to the ion debris removal units 10 and 20, members for supporting the ion debris removal units 10 and 20, respectively, are mounted in the obscuration region E.

Figure 7:
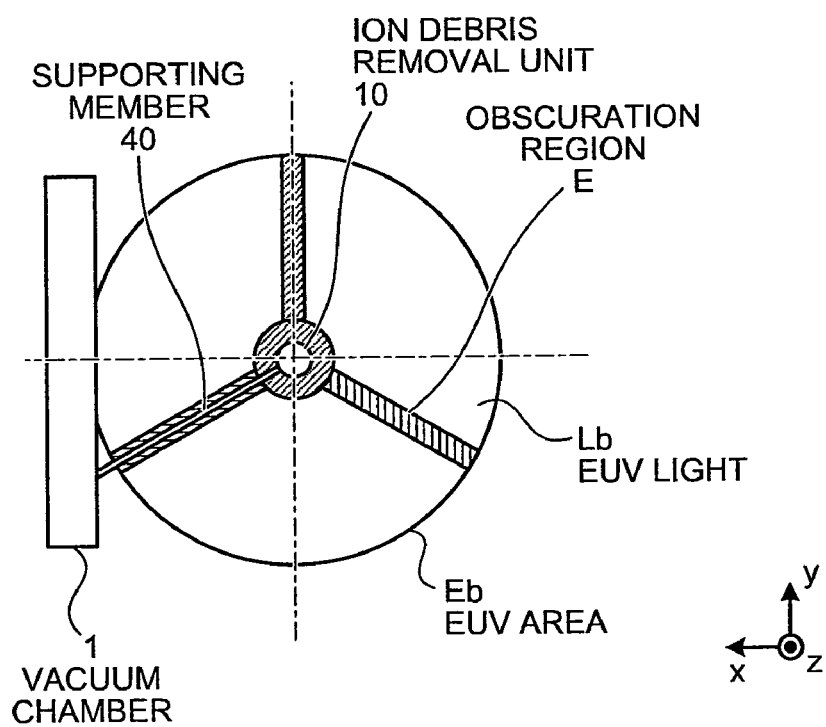
FIG. 7 is a horizontal cross-sectional diagram showing a structure of an extreme ultraviolet light source apparatus according to a third embodiment of the present invention.
Figure 8:
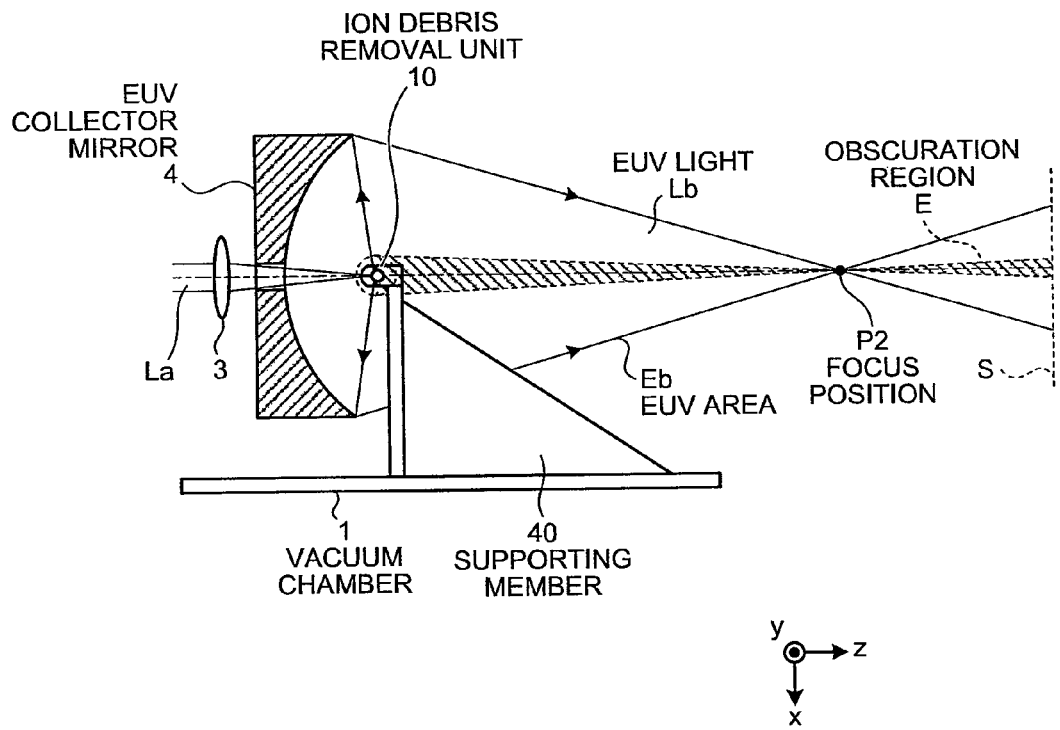
FIG. 8 is a vertical cross-sectional diagram showing a structure of the extreme ultraviolet light source apparatus according to the third embodiment.

FIG. 7 is a horizontal cross-sectional diagram showing a structure of an extreme ultraviolet light source apparatus according to the third embodiment of the present invention. FIG. 8 is a vertical cross-sectional diagram showing a structure of the extreme ultraviolet light source apparatus according to the third embodiment of the present invention. As shown in FIGS. 7 and 8, a cross-section perpendicular to an optical axis of the EUV light Lb passing through a region (hereinafter to be referred to as an EUV area Eb) where the EUV light Lb reflected by the EUV collector mirror 4 passes through may include not only a central region but also a radial obscuration regions E which expand radially from the central region. In this particular embodiment, supporting members 40 for supporting the ion debris removal unit 10 are arranged in such radial obscuration region E. The supporting members 40 are fixed on a wall surface of the vacuum chamber 1.

Figure 9:
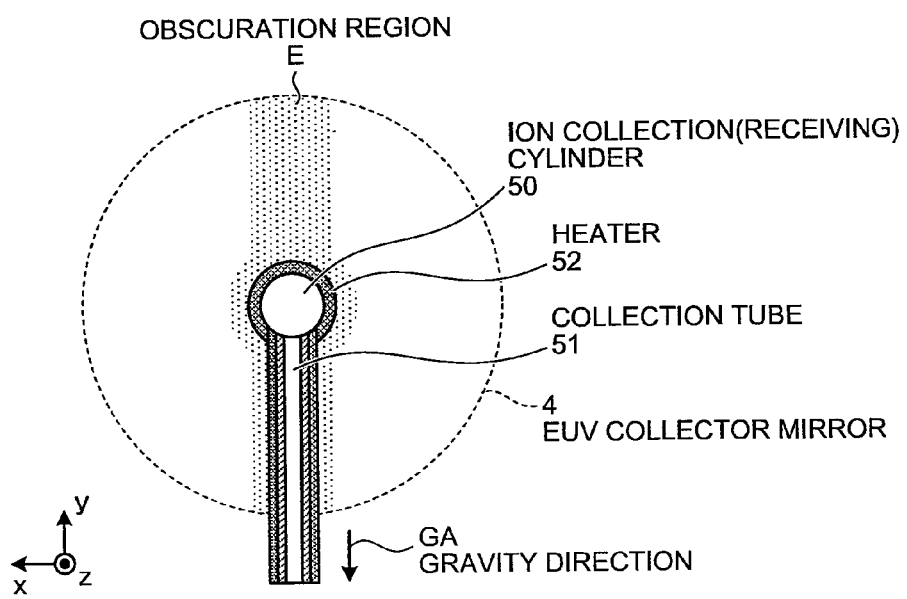
FIG. 9 is a cross-sectional diagram showing a structure of an ion debris removal unit in the extreme ultraviolet light source apparatus according to the third embodiment.

Furthermore, in the third embodiment, as shown in FIG. 9, it is possible to support the ion collection (receiving) cylinder 50 using a collection tube 51 in place of the supporting members 40. The ion collection (receiving) cylinder 50 and the collection tube 51 are covered with a heater 52 which is a temperature regulator, for instance, and thermally controlled to a temperature at which Sn being the ion debris in the ion collection (receiving) cylinder 50 and the collection tube 51 will melt. The molten ion debris are disembogued outside the vacuum chamber 1 via the collection tube 51. In this case, it is preferable to have an axis of the collection tube 51 face in a gravity direction GA such that the molten Sn can be easily discharged outside the vacuum chamber 1.

Figure 10:
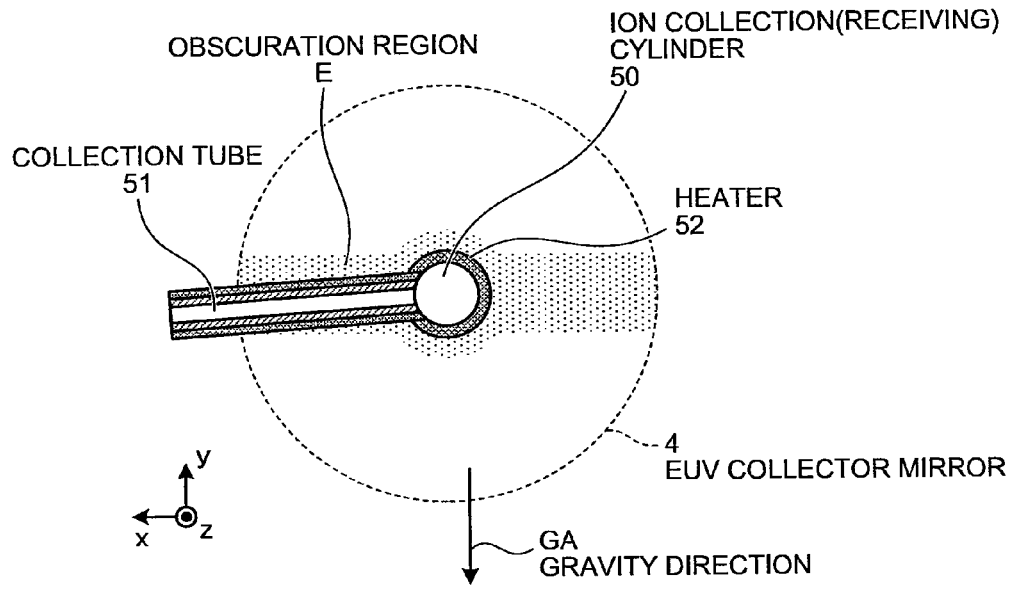
FIG. 10 is a cross-sectional diagram showing a structure of an alternate example of the ion debris removal unit in the extreme ultraviolet light source apparatus according to the third embodiment.

Here, depending on the arrangement of the obscuration region E, there may be a case in that the axis of the collection tube 51 can not be made to face in the gravity direction GA. Even in such case, as shown in FIG. 10, it is preferable to tilt the axis of the collection tube 51 to the gravity direction GA within the obscuration region E in such a way that the collection tube 51 does not protrude from the obscuration region E. The other structures and effects are the same as in the above-described embodiments, and redundant explanations will be omitted herein.

Fourth Embodiment

Next, a fourth embodiment of the present invention will be described in detail. In the above-described first to third embodiments, ion debris is collected (received) by having a local magnetic field or local electric field formed using the ion debris removal unit 10 or 20. On the other hand, in the fourth embodiment, the ion debris removal unit 10 forms an accessorial local electric field in addition to the local magnetic field. Thereby, the collection (receiving) rate and collection (receiving) efficiency of ion debris can be further improved, and thus it is possible to reduce possible collision of debris directed to the EUV collector mirror 4.

Figure 11:
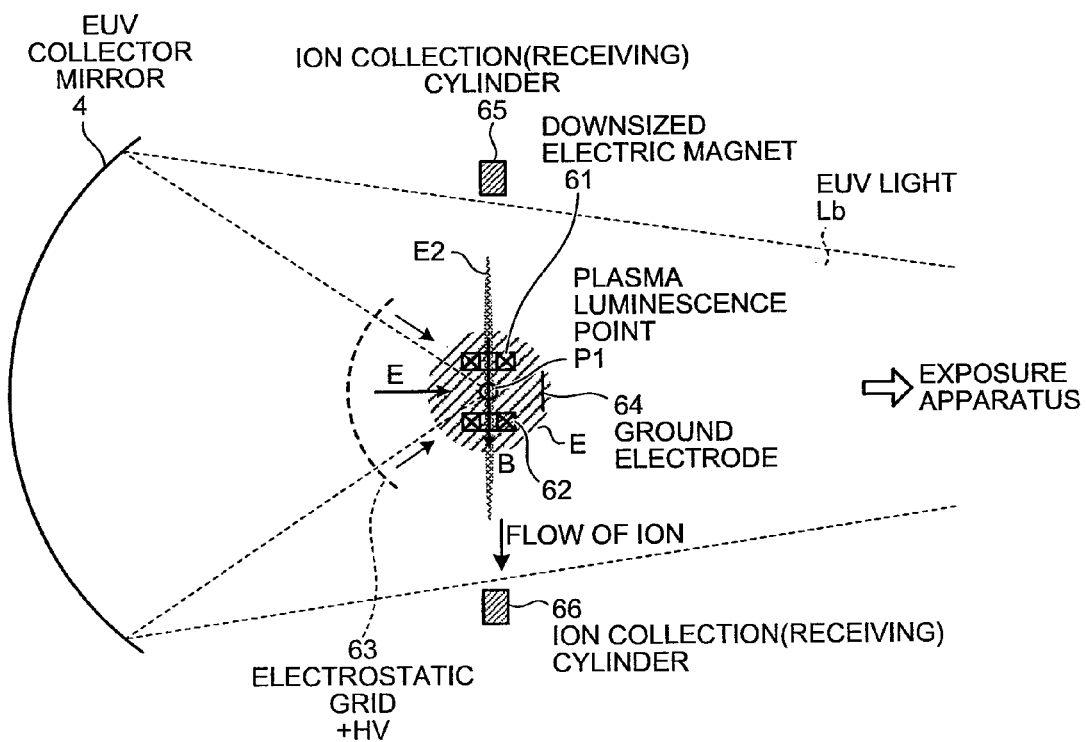
FIG. 11 is a schematic diagram showing a structure of an extreme ultraviolet light source apparatus according to a fourth embodiment of the present invention.

FIG. 11 is a schematic diagram showing an outline structure of an extreme ultraviolet light source apparatus according to the fourth embodiment of the present invention. As shown in FIG. 11, in the extreme ultraviolet light source apparatus according to this particular embodiment, as in the first embodiment, a pair of small electric magnets 61 and 62 are located in the obscuration region E. The small electric magnets 61 and 62 form a convergence region E2 where ion debris generated at the plasma luminescence point P1 are converged in bore directions (magnetic field direction) and trapped. The ion debris (positive ion debris, negative ion debris) trapped in the convergence region E2 will drift depending on the polar character thereof, respectively, and then, is collected (received) by the ion collection (receiving) cylinders 65 and 66. Furthermore, the extreme ultraviolet light source apparatus according to the fourth embodiment comprises an electrostatic grid 63 having a concave face with a solid angle covering the EUV collector mirror 4 with respect to the plasma luminescence point P1, and a ground electrode 64 located in the obscuration region E as facing the electrostatic grid 63 through the plasma luminescence point P1. The electrostatic grid 63 is located on a side of the EUV collector mirror 4 with respect to the plasma luminescence point P1 while being outside the obscuration region E, and functions as the electrostatic grid 30 in the second embodiment. By this arrangement, in this particular embodiment, it is possible to draw back high energy ion debris flying toward the EUV collector mirror 4 to the side of the plasma luminescence point P1 by a reactive Coulombic force.

In the fourth embodiment, as described above, the local electric field that draws back the high energy ion debris flying out from the local magnetic field to the plasma luminescence point P1 is formed. As a result, according to this particular embodiment, it is possible to reduce influence of ion debris on the desired optical elements while it is possible to improve the collection (receiving) efficiency of ion debris. The other structures and effects are the same as in the above-described embodiments, and redundant explanations will be omitted herein.

Fifth Embodiment

Figure 12:
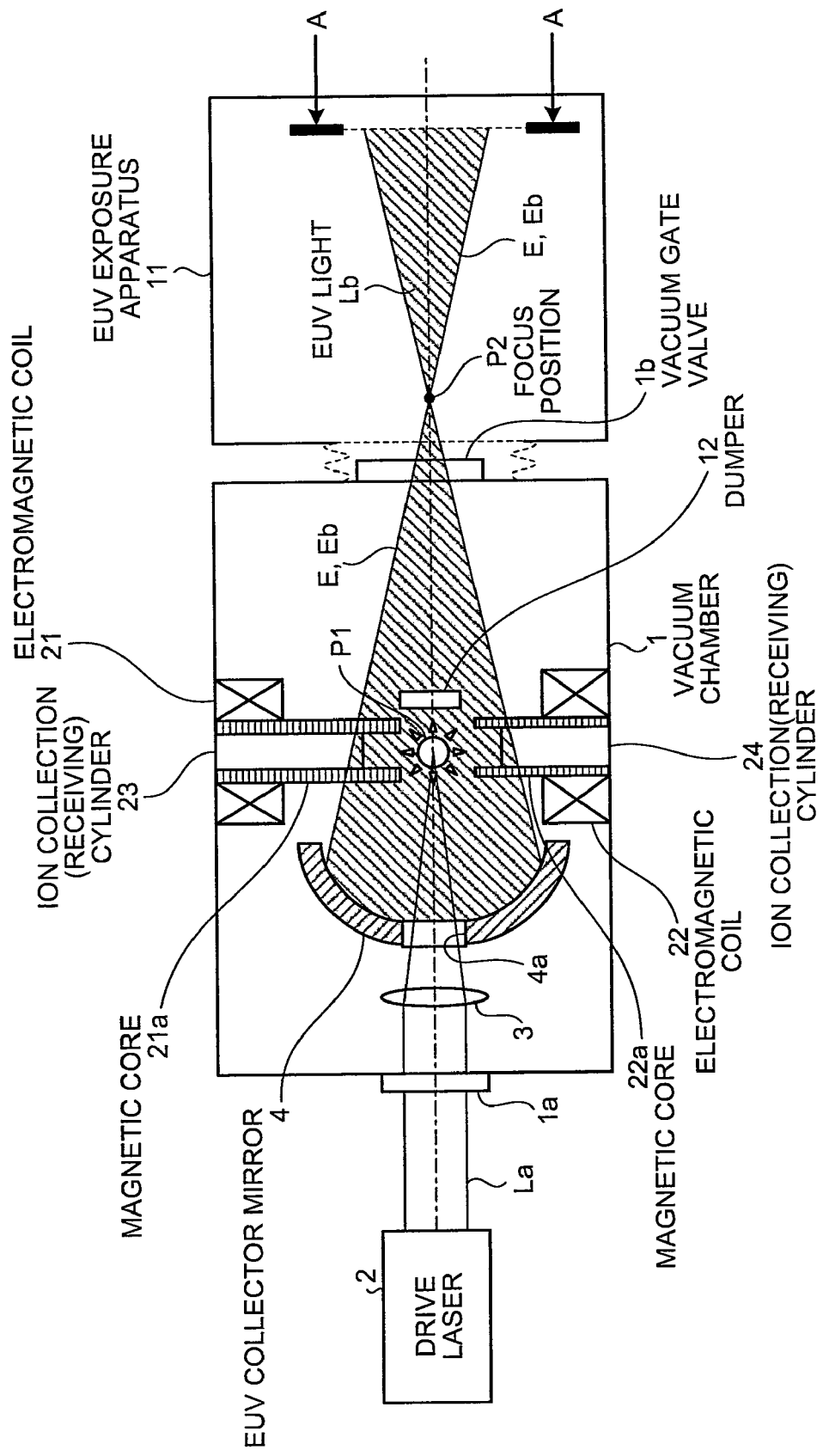
FIG. 12 is a horizontal cross-sectional diagram showing an outline structure of an extreme ultraviolet light source apparatus according to a fifth embodiment of the present invention.
Figure 13:
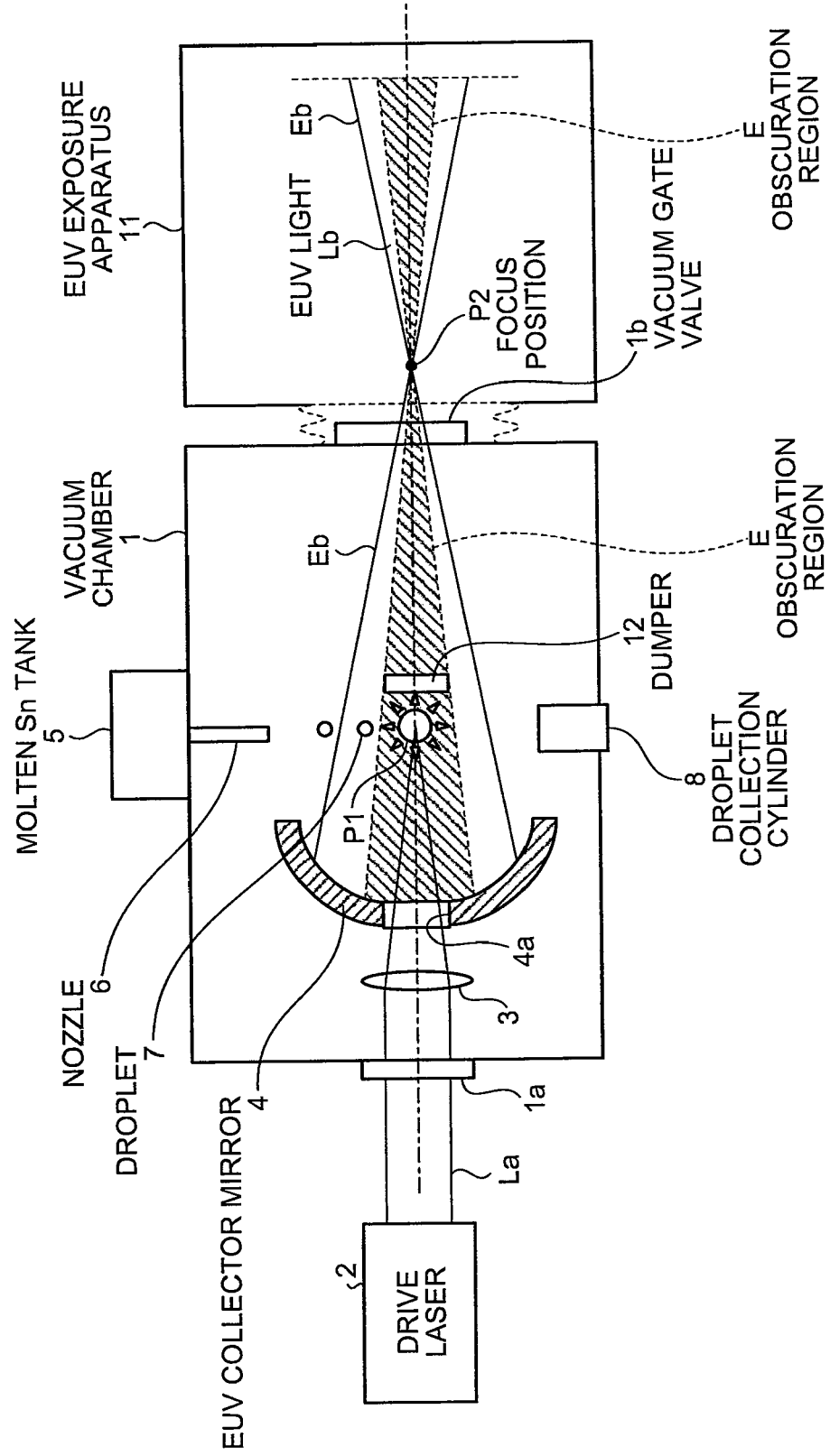
FIG. 13 is a vertical cross-sectional diagram showing an outline structure of the extreme ultraviolet light source apparatus according to the fifth embodiment.
Figure 14:
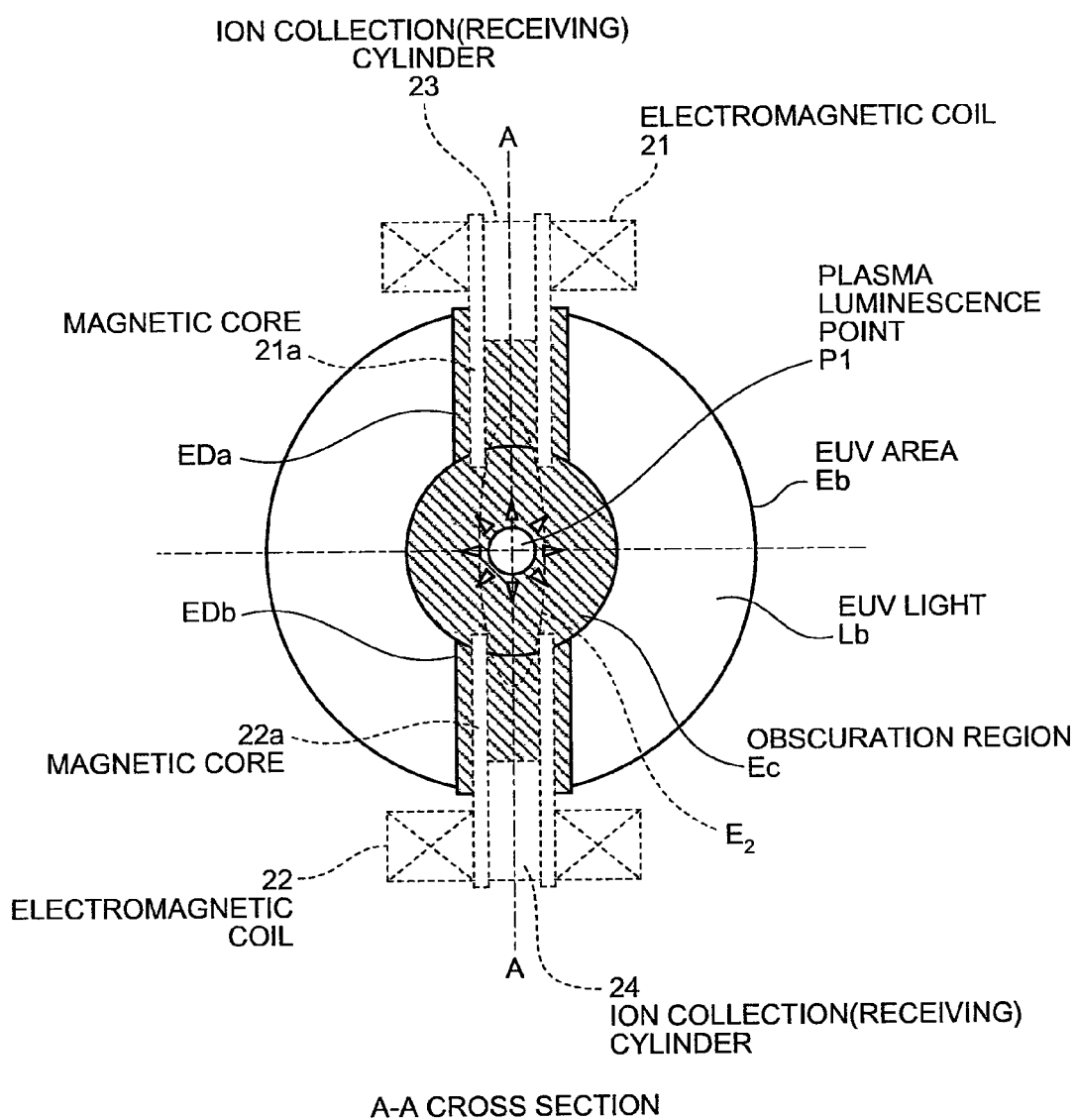
FIG. 14 is a diagram showing an example of a far field pattern formed on A-A surface in FIG. 12.

Next, a fifth embodiment of the present invention will be described in detail. FIG. 12 is a horizontal cross-sectional diagram showing an outline structure of an extreme ultraviolet light source apparatus according to the fifth embodiment of the present invention. FIG. 13 is a vertical cross-sectional diagram showing an outline structure of the extreme ultraviolet light source apparatus according to the fifth embodiment. FIG. 14 is a diagram showing an example of a far field pattern formed on A-A surface in FIG. 12.

As shown in FIGS. 12 to 14, the extreme ultraviolet light source apparatus according to this particular embodiment has magnetic cores 21a and 22a respectively extending from the electromagnetic coils 21 and 22 which are located outside the passing region (the EUV area Eb) of the EUV light Lb reflected by the EUV collector mirror 4. Ion debris generated around the plasma luminescence point P1 are converged in a certain definite range (the convergence region E2) by a magnetic field formed by the magnetic cores 21a and 22a when electrical current is applied to the electromagnetic coils 21 and 22.

The magnetic cores 21a and 22a extend from the electromagnetic coils 21 and 22, respectively, into the obscuration region E in the EUV area Eb. Here, as a far field pattern in FIG. 14 indicates, the EUV area Eb includes an obscuration region Ec corresponding to the aperture 4a at the center portion, and further includes strip-shaped obscuration regions EDa and EDb expanding radially from an obscuration region Ec located at the center portion to an exterior edge of the EUV area Eb. The strip-shape obscuration regions EDa and EDb are regions which are shadowed by the optical systems located in the vacuum chamber 1 and by ion debris drifted from the plasma luminescence point P1. Therefore, in this particular embodiment, the magnetic cores 21a and 22a are located in such a way that the parts extending into the EUV area Eb are located as being included in the strip-shape obscuration regions EDa and EDb, respectively. Accordingly, it is possible to locate the magnetic cores 21a and 22a so that heads of the magnetic cores 21a and 22a as being origins of the magnetic field face closely to each other while sandwiching the plasma luminescence point P1 in between without shutting off the EUV light Eb to be used for exposure in the EUV exposure apparatus 11. As a result, it is possible to locally form a strong magnetic field around the plasma luminescence point P1, and it is possible to steadily converge ion debris generated around the plasma luminescence point P1 and effectively lead the ion debris toward desired directions (directions toward the ion collection (receiving) cylinders 23 and 24).

In this particular embodiment, as shown in FIGS. 12 and 14, at least a part of or whole of the ion collection (receiving) cylinders 23 and 24 are located in the bores of the electromagnetic coils 21 and 22, respectively. Specifically, the ion collection (receiving) cylinders 23 and 24 are located inside the tubular magnetic cores 21a and 22a which are arranged as passing through the insides of the bores of the electromagnetic coils 21 and 22. Thereby, it is possible to have the ion collection (receiving) cylinders 23 and 24 steadily collect (receive) ion debris drifting along the magnetic field having been formed by the magnetic cores 21a and 22a and passing through the bore of each of the electromagnetic coils 21 and 22. In this arrangement, by locating at least parts of the ion collection (receiving) cylinders 23 and 24 inside the obscuration regions EDa and EDb in the EUV area Eb, it is possible to shorten a distance between the plasma luminescence point P1 and the ion collection (receiving) cylinders 23 and 24, respectively. Thus, it is possible to make a trapping solid angle with respect to an existence area of ion debris (the convergence region E2) larger, whereby it is possible to have the ion collection (receiving) cylinders 23 and 24 steadily collect (receive) ion debris generated around the plasma luminescence point P1.

In this respect, in this particular embodiment, the ion collection (receiving) cylinders 23 and 24 are located in the strip-shape obscuration regions EDa and EDb that expand from the obscuration region Ec to the exterior edge of the EUV area Eb. By this arrangement, as compared with the case where the ion collection (receiving) cylinders 23 and 24 are located in the obscuration region Ec, required degree of miniaturization for the ion collection (receiving) cylinders 23 and 24 can be relaxed. As a result, it is possible to make the ion collection (receiving) cylinders 23 and 24 retaining a sufficient trapping solid angle with respect to the convergence region E2, whereby it is possible to have the ion collection (receiving) cylinders 23 and 24 steadily collect (receive) ion debris drifting from around the plasma luminescence point P1.

Moreover, by locating the ion collection (receiving) cylinders 23 and 24 in the obscuration regions EDa and EDb, it is possible to space between the plasma luminescence point P1 and the ion collection (receiving) cylinders 23 and 24, respectively, to a certain degree, and therefore, it is also possible to achieve an effect that possible damages of the ion collection (receiving) cylinder 23 and 24 caused by the high energy ion debris generated around the plasma luminescence point P1 can be reduced.

The other structures and effects are the same as in the above-described embodiments, and redundant explanations will be omitted herein. Furthermore, in this particular embodiment, the case where the electromagnetic coils 21 and 22 are located outside the EUV area Eb but inside the vacuum chamber 1 has been described as an example. However, the present invention is not limited to such arrangement. The electromagnetic coils 21 and 22 can also be located outside the vacuum chamber 1 or inside the obscuration region E, for instance.

Sixth Embodiment

Figure 15:
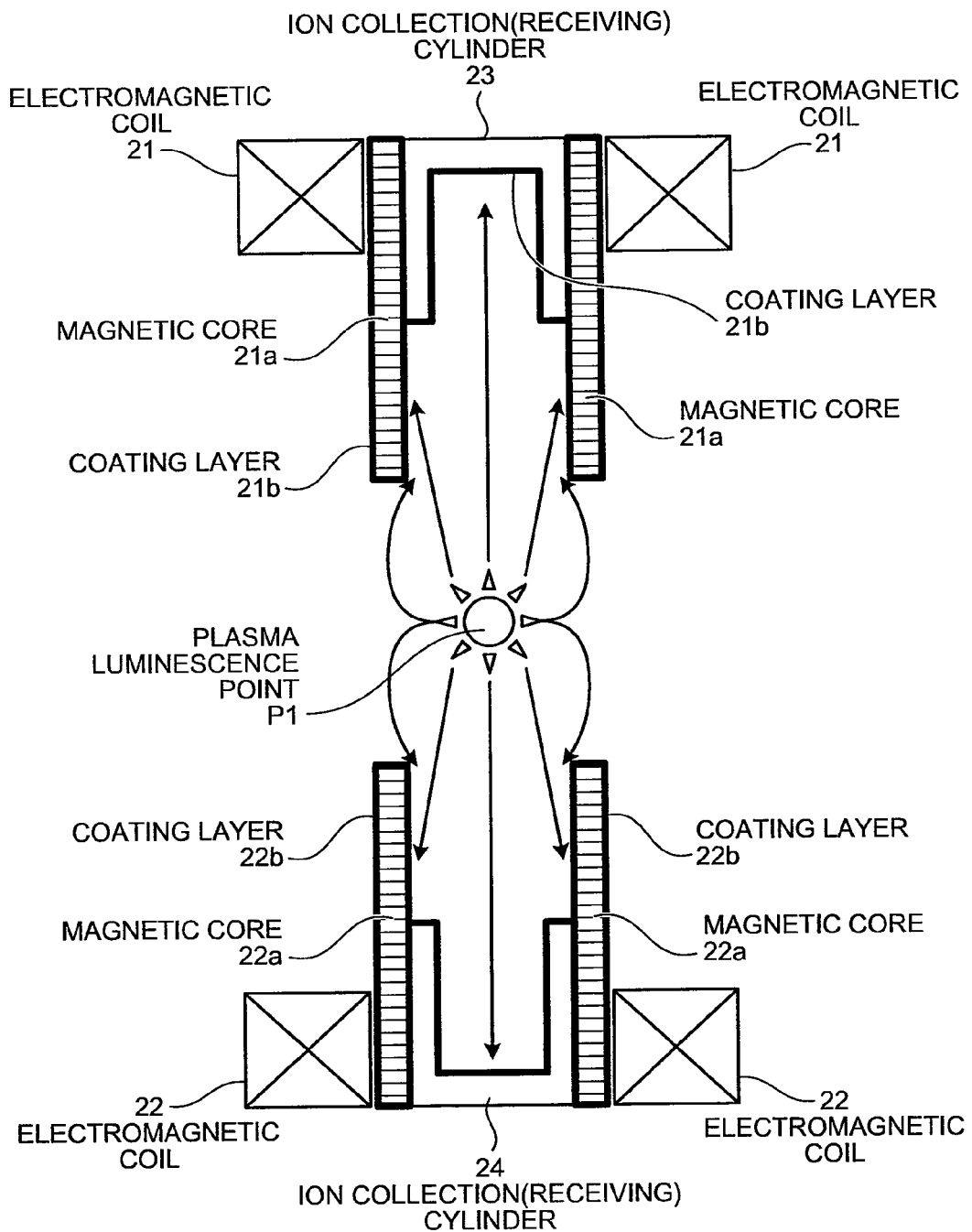
FIG. 15 is a diagram showing an electromagnetic coil, a magnetic core and an ion collection (receiving) cylinder in an extreme ultraviolet light source apparatus according to a sixth embodiment of the present invention.

Next, a sixth embodiment of the present invention will be described in detail. FIG. 15 is a diagram showing an electromagnetic coil and an ion collection (receiving) cylinder in an extreme ultraviolet light source apparatus according to the sixth embodiment of the present invention. As shown in FIG. 15, the extreme ultraviolet light source apparatus according to this particular embodiment has the same structure as the extreme ultraviolet light source apparatus according to the above-described fifth embodiment, except that surfaces of the magnetic cores 21a and 22a are coated with coating layers 21b and 22b, respectively.

The coating layers 21b and 22b are coatings for preventing the surfaces of the magnetic cores 21a and 22a from being sputtered by ion debris. In order to form a strong magnetic field around the plasma luminescence point P1, it is effective that the magnetic cores 21a and 22a are arranged to be located around the plasma luminescence point P1 as close as possible.

However, if the magnetic cores 21a and 22a are too close to the plasma luminescence point P1, the magnetic cores 21a and 22a may be sputtered by comparatively high energy ion debris generated around the plasma luminescence point P1. Particles made from a construction material of the magnetic cores 21a and 22a, which are generated by the magnetic cores 21a and 22a being sputtered, adhere to the EUV collector mirror 4, and so on, to become a factor that decreases reflectance. Therefore, it is preferable to prevent the magnetic cores 21a and 22a from being sputtered wherever possible.

Accordingly, as already mentioned, in this particular embodiment, the magnetic cores 21a and 22a are coated with the coating layers 21b and 22b. Thus, it is possible to prevent the magnetic cores 21a and 22a from being sputtered, whereby it is possible to locate the magnetic cores 21a and 22a near the plasma luminescence point P1 more closely. As a result, it is possible to steadily and effectively lead ion debris to the ion collection (receiving) cylinders 23 and 24.

As a material of the coating layers 21b and 22b, carbon (C) which has a high resistance with respect to sputtering, for instance, can be used. Here, when Sn is used as the target, for instance, as the material of the coating layers 21b and 22b, it is preferable to use titanium (Ti) which has a high wettability with respect to liquid Sn and a comparatively high resistance with respect to sputtering. This is because, by using porous Ti as a coating material, liquid Sn adhered to the surfaces of the coating layers 21b and 22b infiltrate into porus of the porous material. As a result, hardly any Sn will exist on the surface of the porous Ti, and thereby, the surfaces of the coating layers 21b and 22b coating the magnetic cores 21a and 22a may become hard to be sputtered even if Sn ion collide with the coating films 21b and 22b.

The other structures and effects are the same as in the above-described embodiments, and redundant explanations will be omitted herein. Furthermore, in this particular embodiment, the case where the magnetic cores 21a and 22a are coated with the coating layers 21b and 22b has been described as an example. However, the present invention is not limited to such arrangement, while it is possible to coat members such as the ion collection (receiving) cylinders 23 and 24, and so on, having possibilities of being sputtered by ion debris, with the coating films 21b and 22b.

Seventh Embodiment

Figure 16:
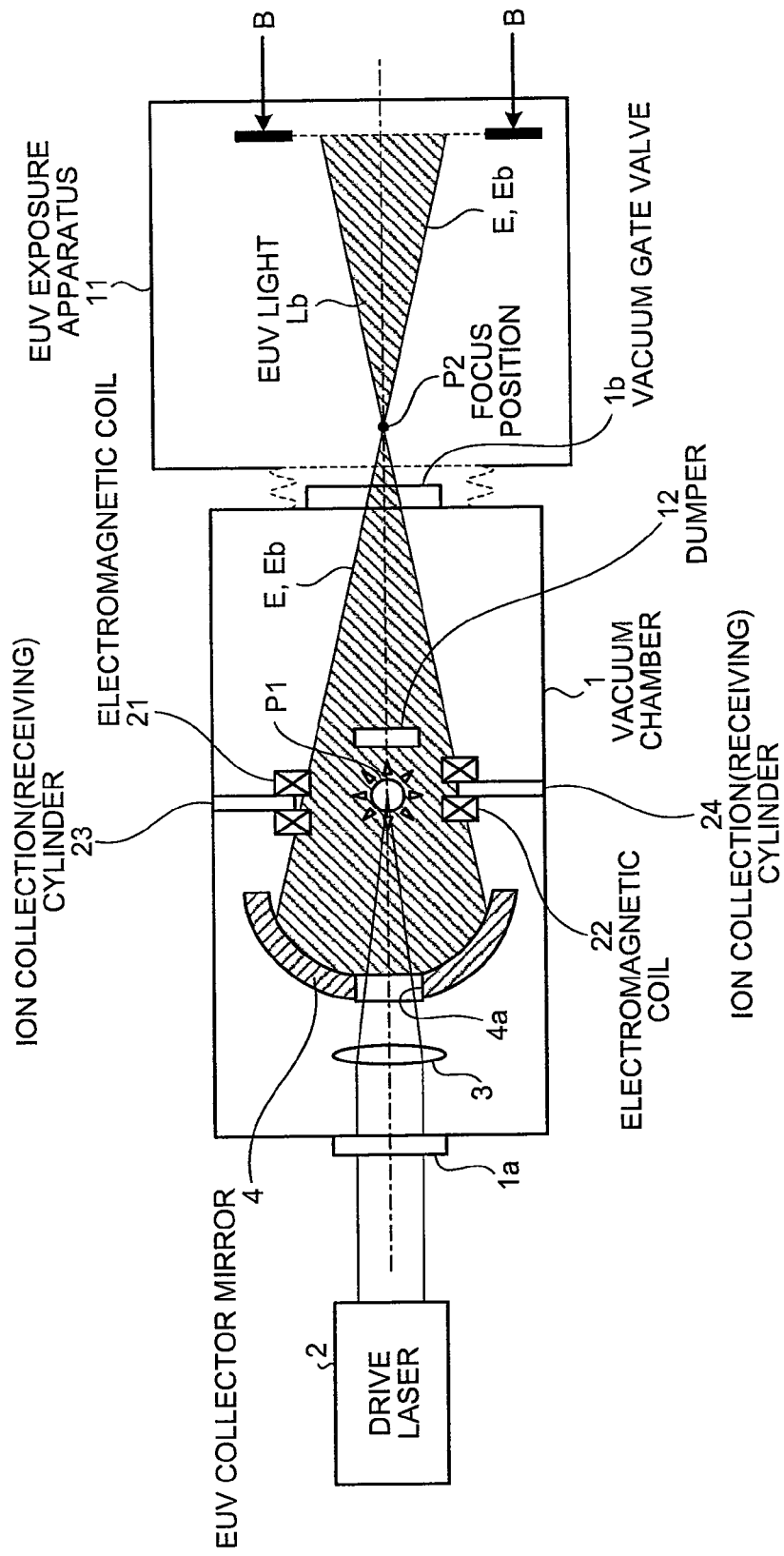
FIG. 16 is a horizontal cross-sectional diagram showing an outline structure of an extreme ultraviolet light source apparatus according to a seventh embodiment of the present invention.
Figure 17:
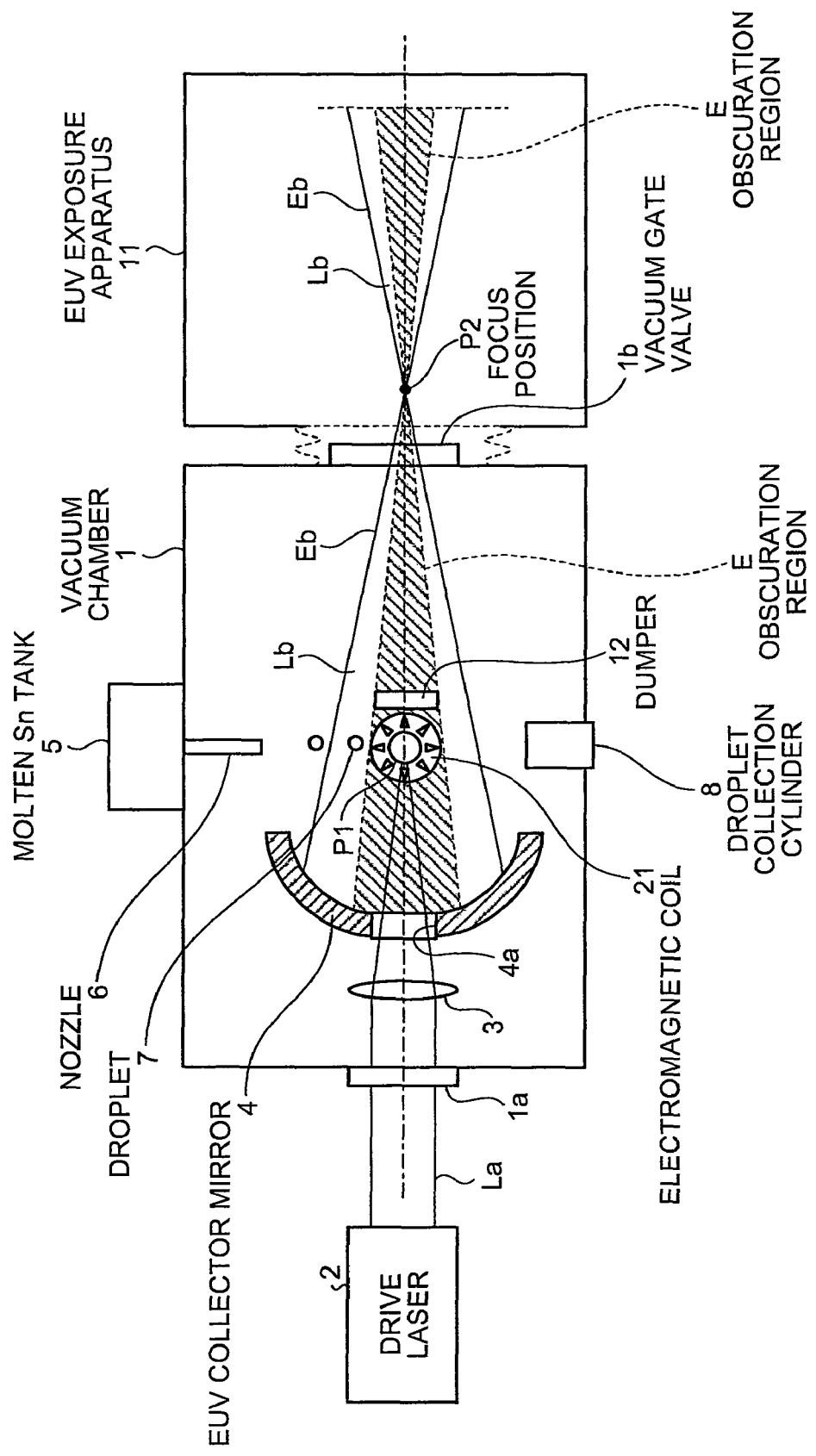
FIG. 17 is a vertical cross-sectional diagram showing an outline structure of the extreme ultraviolet light source apparatus according to the seventh embodiment.
Figure 18:
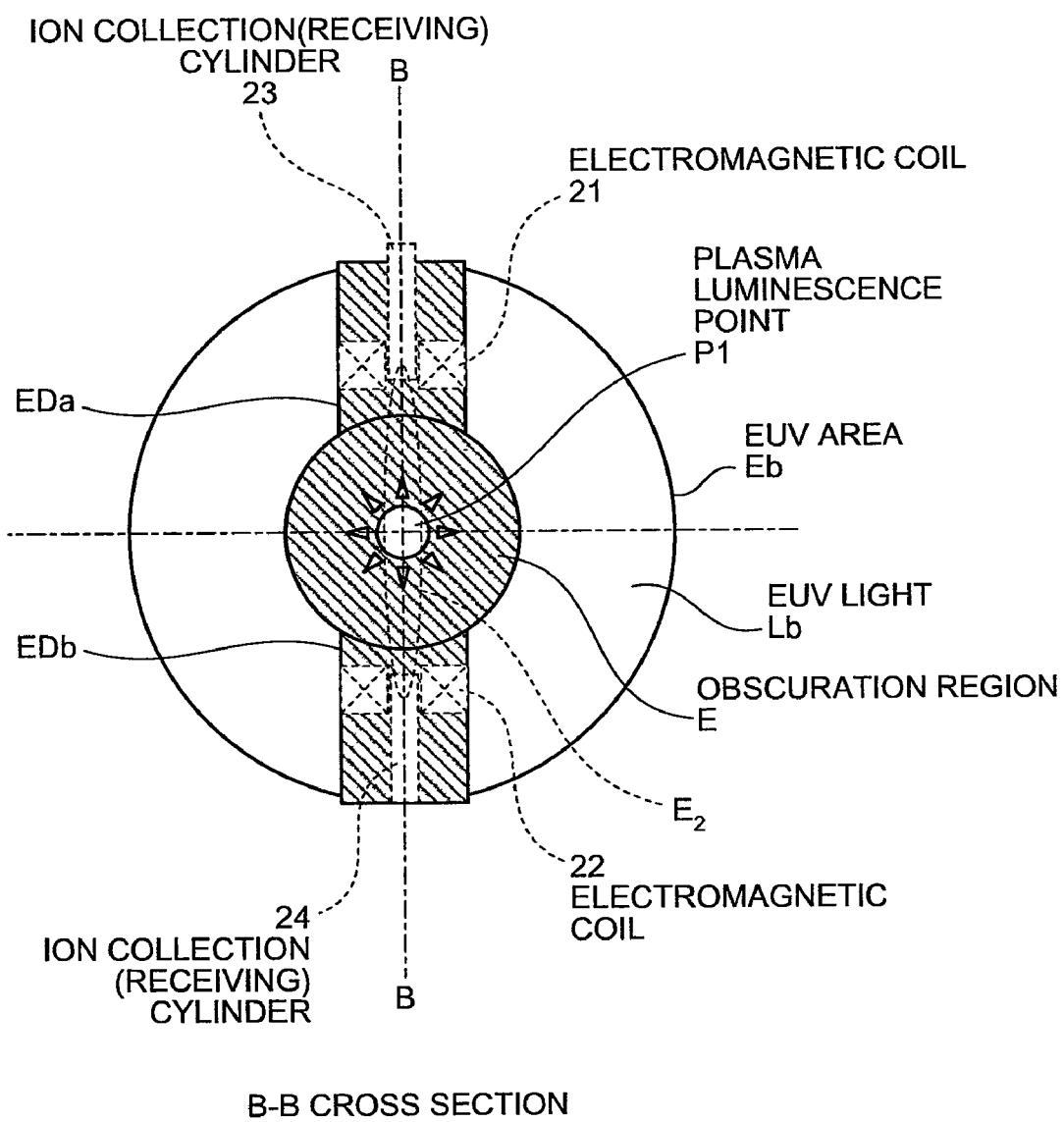
FIG. 18 is a diagram showing an example of a far field pattern formed on B-B surface in FIG. 16.

Next, a seventh embodiment of the present invention will be described in detail. FIG. 16 is a horizontal cross-sectional diagram showing an outline structure of an extreme ultraviolet light source apparatus according to the seventh embodiment of the present invention. FIG. 17 is a vertical cross-sectional diagram showing an outline structure of the extreme ultraviolet light source apparatus according to the seventh embodiment. FIG. 18 is a diagram showing an example of a far field pattern formed on B-B surface in FIG. 16.

As shown in FIGS. 16 to 18, the extreme ultraviolet light source apparatus according to the present embodiment has the same structure as the extreme ultraviolet light source apparatus according to the above-described fifth embodiment shown in FIGS. 12 to 14. However, in the extreme ultraviolet light source apparatus according to this particular embodiment, the magnetic cores 21a and 22a are omitted, while at least parts of the electromagnetic coils 21 and 22 are alternatively located in the obscuration region E (in particular, in the obscuration regions EDa and EDb).

Even according to such structure, as in the case of the above-described fifth embodiment, it is possible to closely locate the electromagnetic coils 21 and 22 as being origins of the magnetic field in such a way that the electromagnetic coils 21 and 22 face closely to each other while sandwiching the plasma luminescence point P1 in between without shutting off the EUV light Eb to be used for exposure in the EUV exposure apparatus 11. Thereby, it is possible to locally form a strong magnetic field around the plasma luminescence point P1. As a result, it is possible to steadily trap ion debris generated around the plasma luminescence point P1 in the convergence region E2 and effectively lead the ion debris toward desired directions (directions toward the ion collection (receiving) cylinders 23 and 24).

Furthermore, the ion collection (receiving) cylinders 23 and 24 are supporting the magnetic coils 21 and 22 by being extended inside the bores of the magnetic coils 21 and 22 from the wall surface of the vacuum chamber 1, respectively, and being fixed to the magnetic coils 21 and 22 inside the bores, respectively. Thereby, as in the case of the above-described fifth embodiment, it is possible to have the ion collection (receiving) cylinders 23 and 24 steadily collect (receive) ion debris drifting along the magnetic field passing through the bore of each of the electromagnetic coils 21 and 22. In this arrangement, as in the case of the above-described fifth embodiment, by locating at least parts of the ion collection (receiving) cylinders 23 and 24 inside the obscuration regions EDa and EDb in the EUV area Eb, it is possible to shorten a distance between the plasma luminescence point P1 and the ion collection (receiving) cylinders 23 and 24, respectively, and thus, it is possible to make a trapping solid angle with respect to an existence area of ion debris (the convergence region E2) larger, whereby it is possible to have the ion collection (receiving) cylinders 23 and 24 steadily collect (receive) ion debris generated around the plasma luminescence point P1.

The other structures and effects are the same as the above-described embodiments, and redundant explanations will be omitted herein. Furthermore, as in the above-described sixth embodiment, in this particular embodiment also, it is preferable to have the electromagnetic coils 21 and 22 coated with the coating layers 21b and 22b. Thereby, it is possible to prevent conductive materials such as capper (Cu) constructing the electromagnetic coils 21 and 22 from being sputtered.

In the above-described first to seventh embodiments, neutral particles, and so forth, in the convergence region E2 are not ionized. However, it is possible to facilitate trapping of debris by further mounting an ionization means such as an x-irradiator, an electron-irradiator, an ultraviolet irradiator, a microwave irradiator, an EUV light irradiator, or the like. Moreover, in each embodiment described above, the electromagnetic coils 21 and 22 are used as magnets that generate the magnetic field for trapping ion debris. However, the present invention is not limited to such arrangement, while permanent magnets can be used instead.

According to each embodiment described above, due to having the ion debris removal unit mounted in the obscuration region including the plasma luminescence point where plasma is generated, it is possible to achieve such extreme ultraviolet light source apparatus that can output EUV light with desired intensity while being able to have debris being influential to optical element, and so on, collected (received) in the vacuum chamber using a simple structure.

In addition, the above-mentioned embodiments and the alternate examples can be arbitrarily combined with one another.

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general inventive concept of the invention as defined by the appended claims and their equivalents.

What is claimed is:

1. An extreme ultraviolet light source apparatus comprising a vacuum chamber, a target supply unit supplying a target into the vacuum chamber, a laser oscillator outputting a laser light into the vacuum chamber, and a collector mirror outputting an extreme ultraviolet light outside by reflecting the extreme ultraviolet light emitted from the target being ionized as a plasma by irradiation with the laser light at a plasma luminescence point in the vacuum chamber, the extreme ultraviolet light source apparatus comprising:
an ion debris removal unit at least a part of which is located in an obscuration region including the plasma luminescence point.

2. The extreme ultraviolet light source apparatus according to claim 1, further comprising:
a support member supporting the ion debris removal unit from an inner wall of the vacuum chamber, wherein
at least a part of the support member is located in the obscuration region.

3. The extreme ultraviolet light source apparatus according to claim 1, wherein
the ion debris removal unit includes a magnetic field generator located near the plasma luminescence point, the magnetic field generator generating a magnetic field for trapping ion debris.

4. The extreme ultraviolet light source apparatus according to claim 3, wherein
the magnetic field generator is a pair of magnets facing each other while sandwiching the plasma luminescence point in between.

5. The extreme ultraviolet light source apparatus according to claim 3, further comprising:
a collection (receiving) portion collecting (receiving) ion debris trapped by the magnetic field generator.

6. The extreme ultraviolet light source apparatus according to claim 5, further comprising:
a support member supporting the collection (receiving) portion from an inner wall of the vacuum chamber, wherein
at least a part of the support member is located in the obscuration region.

7. The extreme ultraviolet light source apparatus according to claim 5, wherein
the collection (receiving) portion includes a collection tube disemboguing ion debris outside the vacuum chamber for collecting the ion debris, and
the collection (receiving) portion and the collection tube have temperature regulators maintaining a temperature of the ion debris at a melting temperature of the ion debris.

8. The extreme ultraviolet light source apparatus according to claim 5, wherein
the collection (receiving) portion collects (receives) the ion debris via an inside of a bore of the magnetic field generator.

9. The extreme ultraviolet light source apparatus according to claim 5, wherein
at least a part of the collection (receiving) portion is located in the obscuration region.

10. The extreme ultraviolet light source apparatus according to claim 2, wherein
the magnetic field generator includes a pair of magnets located outside the obscuration region in such a way as to face each other while sandwiching the plasma luminescence point in between, and magnetic cores extending inside the obscuration region from the magnets, respectively.

11. The extreme ultraviolet light source apparatus according to claim 10, wherein
the magnetic core is coated with a coating layer.

12. The extreme ultraviolet light source apparatus according to claim 10, further comprising:
a collection (receiving) portion collecting (receiving) ion debris trapped by the magnetic field generator, wherein
a shape of the magnetic core is cylindrical, and
the collection (receiving) portion is located inside the magnetic core being cylindrical.

13. The extreme ultraviolet light source apparatus according to claim 12, further comprising:
a support member supporting the collection (receiving) portion from an inner wall of the vacuum chamber, wherein
at least a part of the support member is located in the obscuration region.

14. The extreme ultraviolet light source apparatus according to claim 12, wherein
the collection (receiving) portion includes a collection tube disemboguing ion debris outside the vacuum chamber for collecting the ion debris, and
the collection (receiving) portion and the collection tube have temperature regulators maintaining a temperature of the ion debris at a melting temperature of the ion debris.

15. The extreme ultraviolet light source apparatus according to claim 1, further comprising:
an accessorial electrical field generator trapping ion debris, the accessorial electrical field generator being located outside the obscuration region.

16. The extreme ultraviolet light source apparatus according to claim 15, further comprising:
a support member supporting the accessorial electrical field generator from an inner wall of the vacuum chamber, wherein
at least a part of the support member is located in the obscuration region.

17. The extreme ultraviolet light source apparatus according to claim 1, wherein
the ion debris removal unit includes an electrical field generator which is located near the plasma luminescence point, the electrical field generator generating an electrical field for trapping ion debris.

18. The extreme ultraviolet light source apparatus according to claim 17, wherein
the electrical field generator is an electrostatic grid located at a space lying on an incident side of the laser light, the space including the plasma luminescence point.

19. The extreme ultraviolet light source apparatus according to claim 18, further comprising:
a collection (receiving) portion collecting (receiving) ion debris trapped by the electrical field generator.

20. The extreme ultraviolet light source apparatus according to claim 19, wherein the collection (receiving) portion includes a collection tube disemboguing ion debris outside the vacuum chamber for collecting the ion debris, and
the collection (receiving) portion and the collection tube have temperature regulators maintaining a temperature of the ion debris at a melting temperature of the ion debris.

21. The extreme ultraviolet light source apparatus according to claim 19, wherein at least a part of the collection (receiving) portion is located in the obscuration region.

22. The extreme ultraviolet light source apparatus according to claim 21, further comprising:
a support member supporting the collection (receiving) portion from an inner wall of the vacuum chamber, wherein
at least a part of the support member is located in the obscuration region.

23. An extreme ultraviolet light source apparatus comprising a vacuum chamber having an optical window for inputting a laser light inside from outside, a target supply supplying a target into the vacuum chamber, and a collector mirror outputting an extreme ultraviolet light outside by reflecting the extreme ultraviolet light emitted from the target being ionized as a plasma by irradiation with the laser light at a plasma luminescence point in the vacuum chamber, the extreme ultraviolet light source apparatus comprising:
an ion debris removal unit at least a part of which is located in an obscuration region including the plasma luminescence point.

* * * * *

UNITED STATES PATENT AND TRADEMARK OFFICE
CERTIFICATE OF CORRECTION

PATENT NO.        : 8,003,963 B2
APPLICATION NO.   : 12/605725
DATED             : August 23, 2011
INVENTOR(S)       : Shinji Nagai et al.

Page 1 of 1

It is certified that error appears in the above-identified patent and that said Letters Patent is hereby corrected as shown below:

Title Page, Item (73) Assignee:  Gigaphton Inc. should read Gigaphoton Inc.

Signed and Sealed this
Sixth Day of December, 2011

David J. Kappos
*Director of the United States Patent and Trademark Office*